(12) United States Patent
Kim et al.

(10) Patent No.: US 7,256,984 B2
(45) Date of Patent: Aug. 14, 2007

(54) RECONFIGURABLE POWER DISTRIBUTION PANEL

(75) Inventors: Minchul Kim, The Colony, TX (US); Keith Gibson, Richardson, TX (US); Keith Leicht, Sachse, TX (US)

(73) Assignee: Tyco Electronics Power Systems, Inc., Mesquite, TX (US)

( * ) Notice: Subject to any disclaimer, the term of this patent is extended or adjusted under 35 U.S.C. 154(b) by 317 days.

(21) Appl. No.: 11/125,666

(22) Filed: May 10, 2005

(65) Prior Publication Data

US 2006/0256508 A1   Nov. 16, 2006

(51) Int. Cl.
*H02B 1/26* (2006.01)
*H02B 1/04* (2006.01)
*H02B 1/20* (2006.01)

(52) U.S. Cl. .............. 361/624; 361/622; 361/631; 361/634; 361/643; 361/648; 174/68.2

(58) Field of Classification Search ................ None
See application file for complete search history.

(56) References Cited

U.S. PATENT DOCUMENTS

| | | | | |
|---|---|---|---|---|
| 4,159,504 A | * | 6/1979 | Cook | 361/650 |
| 4,685,029 A | * | 8/1987 | Tillman | 361/645 |
| 4,931,903 A | * | 6/1990 | Cole | 361/645 |
| 5,229,922 A | * | 7/1993 | Muramatsu et al. | 361/736 |
| 5,343,356 A | * | 8/1994 | Hancock | 361/637 |
| 5,466,974 A | * | 11/1995 | Sutrina et al. | 307/38 |
| 6,301,095 B1 | * | 10/2001 | Laughlin et al. | 361/624 |
| 6,351,715 B1 | * | 2/2002 | Ykema | 702/62 |
| 6,762,362 B1 | * | 7/2004 | Cavanaugh et al. | 174/68.2 |
| 7,142,411 B2 | * | 11/2006 | McLeod | 361/624 |

* cited by examiner

Primary Examiner—Boris Chérvinsky

(57) ABSTRACT

The present invention provides a reconfigurable power distribution panel, a power distribution system, a method for reconfiguring a power distribution panel, and a method for manufacturing a reconfigurable power distribution panel. The reconfigurable distribution panel, among other elements, may include a first bus bar having a first plurality of contact points thereon and a plurality of circuit protection locations associated therewith and a second bus bar located proximate the first bus bar and having a second plurality of contact points thereon, the second plurality of contact points having the same plurality of circuit protection locations associated therewith. The reconfigurable power distribution panel may further include first and second coupling devices coupleable to a one of the first or second bus bars, respectively, at a chosen circuit protection location, and a circuit protection device coupleable to either the first bus bar or the second bus bar at the chosen circuit protection location by the selection of either the first or second coupling devices.

44 Claims, 4 Drawing Sheets

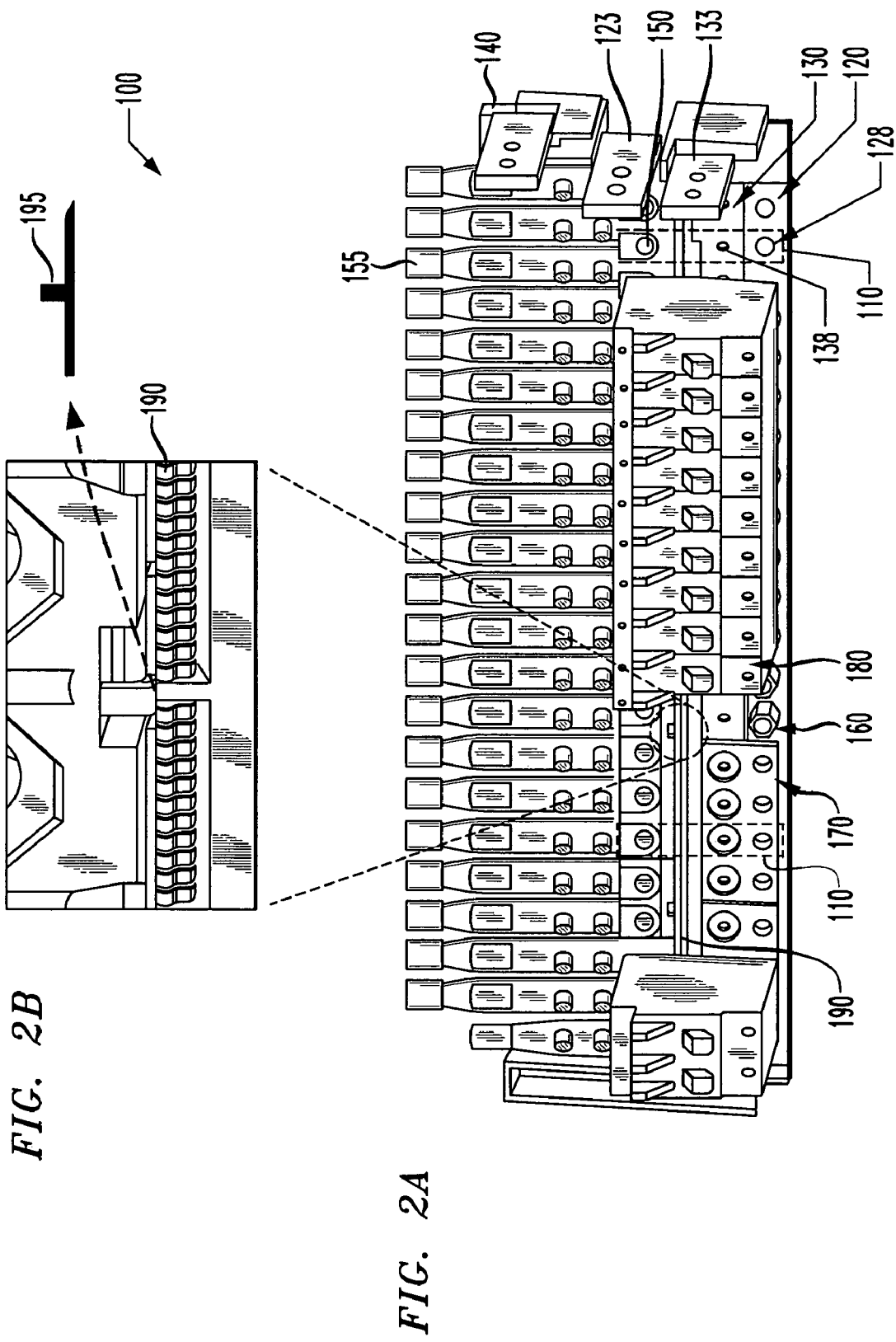

RECONFIGURABLE POWER DISTRIBUTION PANEL

TECHNICAL FIELD OF THE INVENTION

The present invention is directed, in general, to a distribution panel and, more specifically, to a reconfigurable distribution panel.

BACKGROUND OF THE INVENTION

Power distribution panels are generally mounted in an electronic equipment rack with other devices requiring a source of electric power. The basic function of such a distribution panel is to receive electric power, typically DC power, from an external power source and distribute this power through a bus bar to a series of individual circuits for delivery to the equipment mounted in the rack or in nearby equipment racks. Typically, these individual circuits are protected by fuses or circuit breakers. Common voltages for these panels typically range from +24 Volts DC to −48 Volts DC. The bus bars commonly handle up to 300 amps or more and the individual circuits are protected by circuit breakers capable of handling of up to 100 amps or more or by fuses capable of handling up to 128 amps or more. In addition, a power distribution panel may have two separate bus bars, meaning the total current being supplied to a panel could be up to 600 Amps.

The power distribution panels currently used, unfortunately however, are preconfigured and fixed for a particular use. For instance, in those instances where two separate bus bars are being used, one bus bar will be assigned a fixed number of fuses or circuit breakers and the second bus bar will be assigned a different fixed number of fuses or circuit breakers. Unfortunately, situations arise wherein the first bus bar may need more fuses or circuit breakers and the second bus bar may need less fuses or circuit breakers, and the fixed design does not accommodate this need. This is particularly the instance when the distribution panel has been in use for a period of time and its power distribution requirements have changed.

Accordingly, what is needed in the art is a reconfigurable distribution panel that does not experience the aforementioned drawbacks of the traditional fixed design distribution panels.

SUMMARY OF THE INVENTION

To address the above-discussed deficiencies of the prior art, the present invention provides a reconfigurable power distribution panel, a power distribution system, a method for reconfiguring a power distribution panel, and a method for manufacturing a reconfigurable power distribution panel. The reconfigurable distribution panel, among other elements, may include a first bus bar having a first plurality of contact points thereon and a plurality of circuit protection locations associated therewith, and a second bus bar located proximate the first bus bar and having a second plurality of contact points thereon, the second plurality of contact points having the same plurality of circuit protection locations associated therewith. The reconfigurable power distribution panel may further include first and second coupling devices coupleable to a one of the first or second bus bars, respectively, at a chosen circuit protection location, and a circuit protection device coupleable to either the first bus bar or the second bus bar at the chosen circuit protection location by the selection of either the first or second coupling devices.

Another embodiment of the present invention is a power distribution system. In addition to certain ones of the elements of the reconfigurable power distribution panel discussed above, the power distribution panel may include a plurality of output contacts located proximate both the first and second bus bars and having the same plurality of circuit protection locations associated therewith, as well as a power consuming device electrically coupled to the one of the plurality of output contacts of the reconfigurable power distribution panel. Other embodiments of the present invention are a method for configuring a power distribution panel and a method for manufacturing a configurable power distribution panel.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which:

FIGS. 2A-3B illustrates plan views of the reconfigurable power distribution panel illustrated in FIGS. 1A-1B as it is being reconfigured to have a different number of circuit protection devices coupled to each of the first and second bus bars.

DETAILED DESCRIPTION

Figures 1A, 1B:
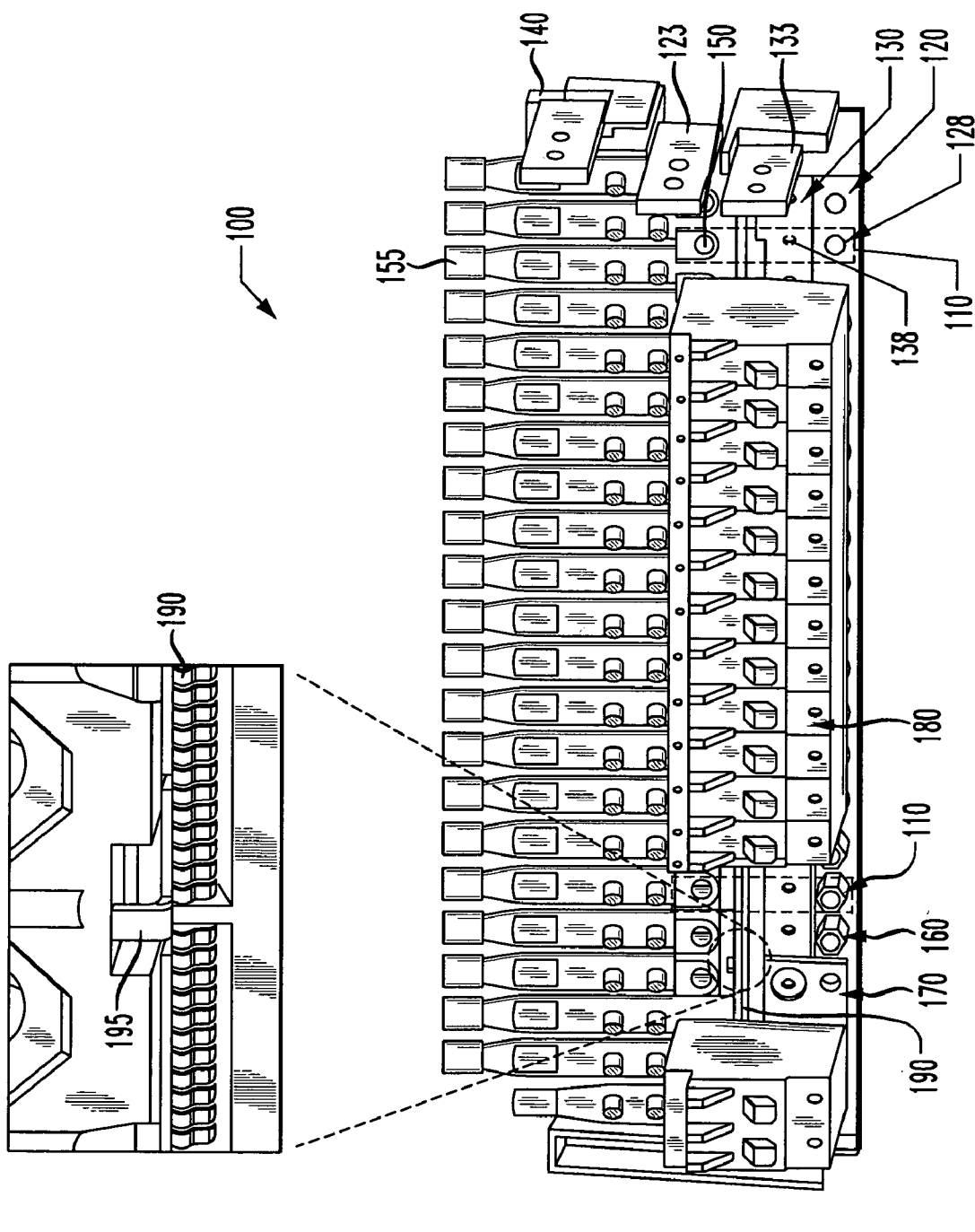
FIG. 1A-1B illustrates a plan view of a reconfigurable power distribution panel manufactured in accordance with the principles of the present invention.

Referring initially to FIG. 1A, illustrated is a plan view of a reconfigurable power distribution panel 100 manufactured in accordance with the principles of the present invention. The reconfigurable power distribution panel 100 illustrated in FIG. 1A initially includes a plurality of circuit protection locations 110. The number of circuit protection locations 110 within the reconfigurable power distribution panel 100 may vary; however, the number is typically less than about 30. In the particular embodiment shown in FIG. 1A, the number of circuit protection locations 110 is 22. In this embodiment the reconfigurable power distribution panel 100 is configured to be mounted in an enclosure, such as a 23 inch rack enclosure. Another embodiment exists wherein the number of circuit protection locations 110 is 16. In this embodiment, the reconfigurable power distribution panel 100 is configured to be mounted in a 19 inch rack enclosure. While certain specific embodiments of the present invention were given with respect to the number of circuit protection locations 110, the inventive aspects of the present invention may be easily used with any number of circuit protection locations 110, whether it be within or outside of the aforementioned disclosed ranges.

The reconfigurable power distribution panel 100 of FIG. 1A further includes a first bus bar 120 having a first bus bar contact 123. As is illustrated in FIG. 1A, the first bus bar 120 has a first plurality of contact points 128 located thereon. In the given embodiment shown, the plurality of contact points 128 happen to be threaded openings tapped into the first bus bar 120, the threaded openings configured to receive a mating portion of a first coupling device 160. However, those skilled in the relevant art understand that the contact points 128 may comprise any type of contact point consistent with the present invention and remain within the purview thereof.

The reconfigurable power distribution panel 100 illustrated in FIG. 1A further includes a second bus bar 130 having a second bus bar contact 133 located proximate the first bus bar 120. In the given example illustrated in FIG. 1A, the second bus bar 130 runs substantially parallel with the first bus bar 120 and is maintained at a raised level with respect to the first bus bar 120. As will be understood more fully below, the raised level of the second bus bar 130 has certain unique advantages.

Similar to the first bus bar 120, the second bus bar 130 has a second plurality of contact points 138 located thereon. The second plurality of contact points 138, similar to the first plurality of contact points 128, may also be threaded openings. In contrast to the first plurality of contact points 128, however, the second plurality of contact points 138 are typically configured to receive a fastening device, such as a threaded fastener, which holds a second coupling device 170 to the second bus bar 130. Those skilled in the relevant art, again, understand that the contact points 138 may comprise any type of contact point consistent with the present invention and remain within the purview thereof.

The first and second bus bars 120, 130, may be constructed in a number of different configurations. For example, one embodiment of the invention has the first bus bar 120 connected to a first voltage and the second bus bar 130 connected to a second different voltage. For example, the first bus bar 120 could be connected to a first voltage of about +24 Volts and the second bus bar could be connected to a second voltage of about −48 Volts. However, other embodiments exist wherein the first bus bar 120 is connected to a DC Voltage and the second bus bar 130 is connected to a battery source. Still another embodiment exists wherein the first and second bus bars 120, 130 are connected to the same DC voltage, but the first bus bar 120 is configured as a primary bus bar and the second bus bar 130 is configured as a secondary bus bar. For instance, the primary bus bar 120 might be coupled to a 911 system, and therefore rarely removed from its power supply, and the secondary bus bar 130 could be coupled to systems running other less important features that may be removed from their power supply.

The illustrative embodiment of the reconfigurable power distribution panel 100 of FIG. 1A further includes a return bus 140. Those skilled in the art understand the purpose of the return bus 140, thus no further detail will be given. While the embodiment illustrated in FIG. 1A contains only a first bus 120, a second bus 130 and a return bus 140, other embodiments conceivably exist wherein additional busses are added to the reconfigurable power distribution panel 100. Accordingly, the present invention is not limited to the three bus configuration illustrated in FIG. 1A. One skilled in the art in view of the teachings herein would readily understand how to manufacture these other conceivable embodiments.

The embodiment of the reconfigurable power distribution panel 100 illustrated in FIG. 1A further includes a plurality of output contacts 150 located proximate both the first and second buses 120, 130. The output contacts 150, as one skilled in the art would expect, are typically electrically coupled to output features 155 of the reconfigurable power distribution panel 100. In this instance, the output features 155 might then be removably coupled to a plurality of power consuming devices feeding therefrom. It is apparent, now, that each of the plurality of circuit protection locations 110 in the embodiment of FIG. 1A contains one associated first contact point 128, one associated second contact point 138 and one associated output contact 150, among other possible elements.

Uniquely coupled to the first bus bar 120 are one or more first coupling devices 160. In the given embodiment illustrated in FIG. 1A, the first coupling devices 160 are electrically coupled to the first contact points 128. In the embodiment wherein the first contact points 128 are threaded openings, the first coupling devices 160 may include a mating portion to engage the threaded openings.

The first coupling devices 160 illustrated in FIG. 1A happen to be standoffs, the standoffs configured to raise a connection point of the first bus bar 120 above the second bus bar 130. Accordingly, when a circuit protection device 180 is coupled to the first bus bar 120 via a first coupling device 160, it will be raised to a height sufficiently above the second bus bar 130 and thus not be in electrical contact therewith. In the embodiment discussed with respect to FIG. 1A, the reconfigurable power distribution panel 100 has about 15 first coupling devices 160 coupled to the first bus bar 120. As will be understood more fully below, this number may vary for the reconfigurable power distribution panel 100, and often varies for the reconfigurable power distribution panel 100 based upon its in field reconfiguration.

Uniquely coupled to the second bus bar 130 are one or more second coupling devices 170. In the given embodiment illustrated in FIG. 1A, the second coupling devices 170 are electrically coupled to the second contact points 138. In the embodiment wherein the second contact points 138 contain threaded openings, the second coupling devices 170 may include a mating portion to engage the second contact points 138, and a threaded fastener may then mate with the threaded openings and be used to secure the second coupling devices 170 to the second bus bar 130.

The second coupling devices 170 illustrated in FIG. 1A happen to be adapter plates, the adapter plates configured to extend from and parallel to an outer surface of the second bus bar 130 and raise a connection point of the second bus bar 130 above the first bus bar 120. Accordingly, when a circuit protection device 180 is coupled to the second bus bar 130 via a second coupling device 170, it will be raised to a height sufficiently above the first bus bar 120 and thus not be in electrical contact therewith.

In an exemplary embodiment, the second coupling device 170 is configured to extend the connection point to the circuit protection device 180 to be located over the first contact point 128 of the first bus bar 120. Accordingly, the extended location allows the same circuit protection device, or at least circuit protection devices 180 having substantially similar mating mechanisms, to be used when connecting the first bus bar 120 via the first coupling device 160 to the output contact 150 or the second bus bar 130 via the second coupling device 170 to the output contact 150. This unique feature is instrumental in allowing quick, easy, inexpensive, etc. reconfiguration of the reconfigurable power distribution panel 100. Additionally, in a preferred embodiment, a top most portion of the second coupling device 170 is equal in height to a top most portion of the first coupling devices 160. Thus, for a given circuit protection location 110, the circuit protection device 180 couples to the second bus bar 130 via the second coupling device 170 at substantially the same position as the circuit protection device 180 would couple to the first bus bar 120 via the first coupling device 160, assuming that the first coupling device 160 is not there.

The reconfigurable power distribution panel 100 illustrated in FIG. 1A further includes an alarm strip 190 extending along a length of the first or second bus bars 120, 130. The alarm strip 190, as one would expect, provides a signal to the operator of the reconfigurable power distribution panel 100 that one or more circuit protection devices 180 are not working properly. Unique to the present invention, the alarm strip 190 is broken into sections that are coupled or decoupled using alarm jumpers 195, such as shown in FIG. 1B. The alarm jumpers 195 are configured to associate the different portions of the alarm strip 190 with the first bus bar 120 or second bus bar 130, depending on the configuration of the reconfigurable power distribution panel 100. Accordingly, if the first and second bus bars 120, 130, and the first and second coupling devices 160, 170, associated therewith are reconfigured, the alarm strip 190 may be reconfigured accordingly.

Little detail has been given regarding the circuit protection devices 180; however, the circuit protection devices 180 may comprise a variety of different breakers, fuses, etc. and remain within the scope of the present invention. Similarly, the circuit protection devices 180 may be configured to handle various different amps, depending on the specific power consuming device electrically coupled thereto, as well as the use thereof.

Turning now to FIGS. 2A-3B illustrated are plan views of the reconfigurable power distribution panel 100 illustrated in FIG. 1A as it is being reconfigured to have a different number of circuit protection devices 180 coupled to each of the first and second bus bars 120, 130. In the embodiment shown in FIGS. 2A-3B, four of the circuit protection devices 180 originally coupled to the first bus bar 120 in FIG. 1A are now in the process of being coupled to the second bus bar 130. In the illustrative embodiment of FIGS. 2A-3B, this is accomplished by first removing four chosen circuit protection devices 180 from four chosen circuit protection locations 110. Thereafter, the four first coupling devices 160 contacting the first bus bar 120 in the four chosen circuit protection locations 110 may be removed. Subsequently, the four chosen circuit protection locations 110 where the four first coupling devices 160 once were are replaced with four second coupling devices 170 coupled to the second bus bar 130. After securely fixing the four second coupling devices 170 to the second bus bar 130, the four chosen circuit protection devices 180 may be replaced, or in an alternative embodiment, new circuit protection devices 180 substituted for the original four chosen circuit protection devices 180.

In the given example of FIGS. 2A-3B, the four second coupling devices 170 are joined together as a single second coupling device, for example as a single adapter plate. Nevertheless, the single second coupling device 170 spans four circuit protection locations 110, and thus in effect acts as four single second coupling devices 170. Those skilled in the art appreciate, however, that other embodiments exist wherein any number of second coupling devices 170 may be joined together to achieve a desired result. The most accommodating embodiment, however, might be the embodiment wherein single second coupling devices 170 are not coupled together, but used in the number desired.

Figures 3A, 3B:
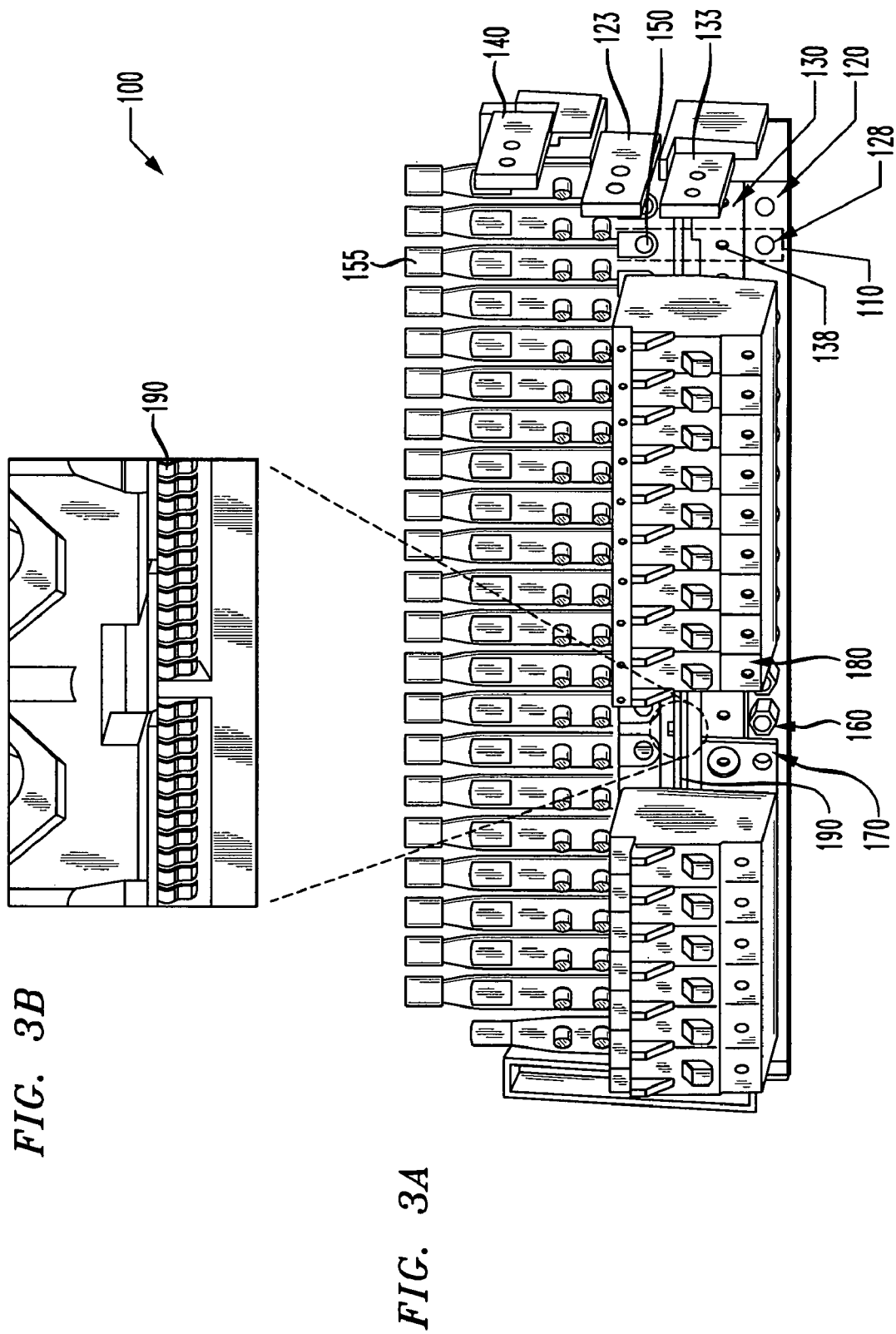

Turning briefly to FIGS. 2B and 3B, illustrated is the idea that the alarm jumper 195 may be removed from the alarm strip 190 to accommodate the new circuit protection devices 180 coupled to the second bus bar 130. Specifically, the alarm jumper 195 shown in FIG. 2B has been removed to cause the portion of the alarm strip 190 to the left of where the alarm jumper 195 once was to be associated with the circuit protection devices 180 coupled to the second bus bar 130, and the portion of the alarm strip 190 to the right of where the alarm jumper 195 once was to be associated with the circuit protection devices 180 coupled to the first bus bar 130. Accordingly, many advantages are attained using the alarm jumper 195 design.

While FIGS. 2A-3B illustrate one embodiment wherein circuit protection devices 180 coupled to the first bus bar 120 are being reconfigured to be coupled to the second bus bar 130, the opposite also holds true. For instance, any number of the second coupling devices 170 may be removed and replaced with the first coupling devices 160, and in turn accomplish the opposite as that illustrated in FIGS. 2A-3B. In this embodiment, however, rather than only removing an alarm jumper 195, an alarm jumper 195 might also need to be added at the appropriate place.

Many advantages may be achieved using the unique aspects of the present invention. First and most likely foremost, the unique aspects of the present invention allow for reconfigurable power distribution panels that are not bound by the factory settings. Accordingly, the reconfigurable design allows for the simple field modification of power distribution panels that were traditionally factory set. Also important, the reconfiguration may be accomplished in relatively little time, as well as the parts required to complete the reconfiguration are simple and inexpensive. Further, the alarm jumpers allow for dual alarm outputs that can be reconfigured along with the reconfiguration of the number of circuit protection devices coupled to each of the first and second bus bars.

Figure 4:
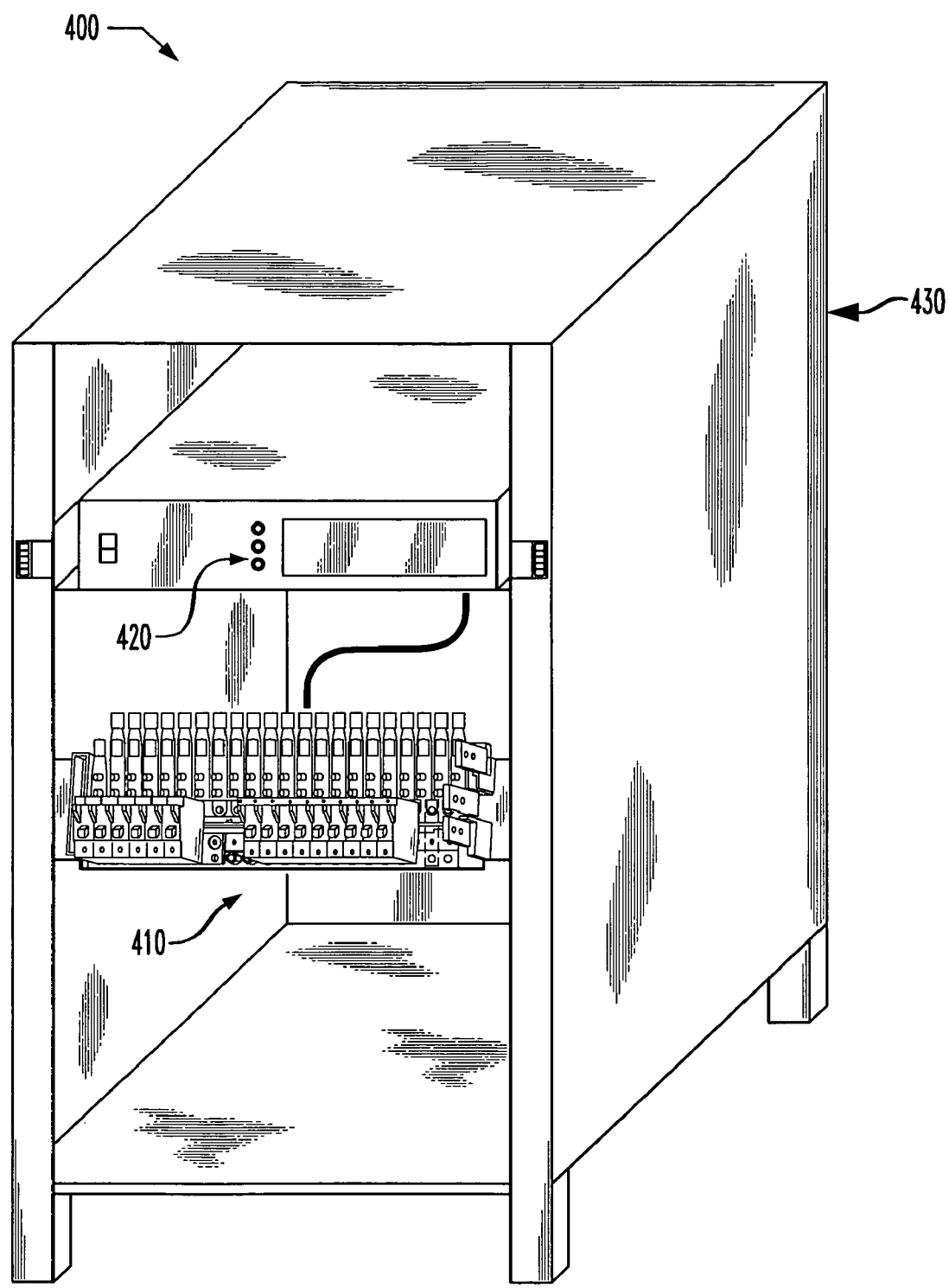
FIG. 4 illustrates a plan view of one embodiment of a power distribution system manufactured in accordance with the principles of the present invention.

Turning now briefly to FIG. 4, illustrated is a plan view of one embodiment of a power distribution system 400 manufactured in accordance with the principles of the present invention. The power distribution system 400 illustrated in FIG. 4 includes at least one reconfigurable power distribution panel 410, which may be similar to the reconfigurable power distribution panel 100 illustrated in FIGS. 1-3B. The power distribution system 400 may further include at least one power consuming device 420 coupled to at least one of the output contacts of the reconfigurable power distribution panel 410. Further, in the embodiment illustrated in FIG. 4, the at least one reconfigurable power distribution panel 410 and the at least one power consuming device 420 are located within an enclosure, such as the rack enclosure 430.

Although the present invention has been described in detail, those skilled in the art should understand that they can make various changes, substitutions and alterations herein without departing from the spirit and scope of the invention in its broadest form.

What is claimed is:

1. A reconfigurable power distribution panel, comprising:
   a first bus bar having a first plurality of contact points thereon and a plurality of circuit protection locations associated therewith;

a second bus bar located proximate the first bus bar and having a second plurality of contact points thereon, the second plurality of contact points having the same plurality of circuit protection locations associated therewith;

first and second coupling devices coupleable to a one of the first or second bus bars, respectively, at a chosen circuit protection location; and a circuit protection device coupleable to either the first bus bar or the second bus bar at the chosen circuit protection location by the selection of either the first or second coupling devices.

2. The reconfigurable power distribution panel recited in claim 1 further including a plurality of output contacts located proximate both the first and second bus bars and having the same plurality of circuit protection locations associated therewith, and wherein the circuit protection device coupleable to either the first bus bar or the second bus bar at the chosen circuit protection location is further coupleable to a one of the plurality of output contacts at the chosen circuit protection location.

3. The reconfigurable power distribution panel recited in claim 2 wherein the first and second bus bars run substantially parallel with each other, the second bus bar being maintained at a raised level with respect to the first bus bar.

4. The reconfigurable power distribution panel recited in claim 3 wherein the first coupling device is a standoff coupleable to a first contact point on the first bus bar at the chosen circuit location, the standoff configured to raise a connection point of the first bus bar to the circuit protection device above the second bus bar.

5. The reconfigurable power distribution panel recited in claim 4 wherein the standoff is configured to raise the connection point of the first bus bar to the circuit protection device to a height such that the circuit protection device is not in electrical contact with the second bus bar.

6. The reconfigurable power distribution panel recited in claim 3 wherein the second coupling device is an adapter plate coupleable to a first contact point on the second bus bar at the chosen circuit location, the adapter plate configured to extend from and parallel to an outer surface of the second bus bar and raise a connection point of the second bus bar to the circuit protection device above the first bus bar.

7. The reconfigurable power distribution panel recited in claim 6 wherein the adapter plate is configured to extend the connection point of the second bus bar to the circuit protection device to be located over a one of the first plurality of contact points in the chosen circuit location.

8. The reconfigurable power distribution panel recited in claim 7 wherein the extended location allows the circuit protection device to have a substantially similar mating mechanism to a second protection device coupleable to the first bus bar and a one of the plurality of output contacts.

9. The reconfigurable power distribution panel recited in claim 1 wherein the first bus bar is configured to carry a first voltage and the second bus bar is configured to carry a second different voltage.

10. The reconfigurable power distribution panel recited in claim 9 wherein the first voltage is greater than the second voltage.

11. The reconfigurable power distribution panel recited in claim 9 wherein the first bus bar is a primary bus bar and the second bus bar is a secondary bus bar.

12. The reconfigurable power distribution panel recited in claim 1 further including an alarm strip extending along a length of the first or second bus bars.

13. The reconfigurable power distribution panel recited in claim 12 wherein the alarm strip includes one or more alarm jumpers configured to associate a first portion of the alarm strip with the first bus bar and associate a second portion of the alarm strip with the second bus bar.

14. A power distribution system, comprising
a reconfigurable power distribution panel, including;
a first bus bar having a first plurality of contact points thereon and a plurality of circuit protection locations associated therewith;
a second bus bar located proximate the first bus bar and having a second plurality of contact points thereon, the second plurality of contact points having the same plurality of circuit protection locations associated therewith;
a plurality of output contacts located proximate both the first and second bus bars and having the same plurality of circuit protection locations associated therewith;
first and second coupling devices coupleable to a one of the first or second bus bars, respectively, at a chosen circuit protection location; and
a circuit protection device coupleable to either the first bus bar or the second bus bar and a one of the plurality of output contacts at the chosen circuit protection location by the selection of either the first or second coupling devices; and
a power consuming device electrically coupled to the one of the plurality of output contacts of the reconfigurable power distribution panel.

15. The power distribution system recited in claim 14 wherein the first and second bus bars run substantially parallel with each other, the second bus bar being maintained at a raised level with respect to the first bus bar.

16. The power distribution system recited in claim 15 wherein the first coupling device is a standoff coupleable to a first contact point on the first bus bar at the chosen circuit location, the standoff configured to raise a connection point of the first bus bar to the circuit protection device above the second bus bar.

17. The power distribution system recited in claim 16 wherein the standoff is configured to raise the connection point of the first bus bar to the circuit protection device to a height such that the circuit protection device is not in electrical contact with the second bus bar.

18. The power distribution system recited in claim 15 wherein the second coupling device is an adapter plate coupleable to a first contact point on the second bus bar at the chosen circuit location, the adapter plate configured to extend from and parallel to an outer surface of the second bus bar and raise a connection point of the second bus bar to the circuit protection device above the first bus bar.

19. The power distribution system recited in claim 18 wherein the adapter plate is configured to extend the connection point of the second bus bar to the circuit protection device to be located over a one of the first plurality of contact points in the chosen circuit location.

20. The power distribution system recited in claim 19 wherein the extended location allows the circuit protection device to have a substantially similar mating mechanism to a second protection device coupleable to the first bus bar and a one of the plurality of output contacts.

21. The power distribution system recited in claim 14 further including an alarm strip extending along a length of the first or second bus bars.

22. The power distribution system recited in claim 21 wherein the alarm strip includes one or more alarm jumpers configured to associate a first portion of the alarm strip with the first bus bar and associate a second portion of the alarm strip with the second bus bar.

23. The power distribution system recited in claim 14 wherein the reconfigurable power distribution panel and the power consuming device are located within an enclosure.

24. The power distribution system recited in claim 23 wherein the enclosure is a rack enclosure.

25. A method for reconfiguring a power distribution panel, comprising:
  providing a reconfigurable power distribution panel, the reconfigurable power distribution panel including;
    a first bus bar having a first plurality of contact points thereon and a plurality of circuit protection locations associated therewith;
    a second bus bar located proximate the first bus bar and having a second plurality of contact points thereon, the second plurality of contact points having the same plurality of circuit protection locations associated therewith;
    a plurality of output contacts located proximate both the first and second bus bars and having the same plurality of circuit protection locations associated therewith;
    a first coupling device coupled to the first bus bar at a first chosen protection location and a second coupling device coupled to the second bus bar at a second chosen circuit protection location; and
    a first circuit protection device coupled to the first bus bar and a first one of the plurality of output contacts at the first chosen circuit protection location and a second circuit protection device coupled to the second bus bar and a second one of the plurality of output contacts at the second chosen circuit protection location;
  removing at least one of the first or second circuit protection devices from the first or second chosen circuit protection locations, respectively;
  exchanging the first or second coupling device from the circuit protection location where the at least one of the first or second circuit protection devices was removed with another second or another first coupling device, respectively;
  replacing the removed at least one of the first or second circuit protection devices into the first or second chosen circuit protection locations, respectively, the exchanging of the first or second coupling devices causing the replaced circuit protection device to be electrically coupled to a different bus bar.

26. The method as recited in claim 25 wherein removing at least one of the first or second circuit protection devices includes removing the first circuit protection device coupled to the first bus bar in the first protection location, wherein the exchanging includes exchanging the first coupling device coupled to the first bus bar in the first protection location for another second coupling device coupled to the second bus bar in the first protection location, and wherein replacing includes replacing the first circuit protection device into the first protection location, the exchanging of the first coupling device for another second coupling device causing the replaced circuit protection device to be electrically coupled to the second bus bar.

27. The method as recited in claim 25 wherein removing at least one of the first or second circuit protection devices includes removing the second circuit protection device coupled to the second bus bar in the second protection location, wherein the exchanging includes exchanging the second coupling device coupled to the second bus bar in the second protection location for another first coupling device coupled to the first bus bar in the second protection location, and wherein replacing includes replacing the second circuit protection device into the second protection location, the exchanging of the second coupling device for another first coupling device causing the replaced circuit protection device to be electrically coupled to the first bus bar.

28. The method as recited in claim 25 wherein the first and second circuit protection devices have similarly spaced mating mechanisms.

29. The method recited in claim 25 wherein the first and second bus bars run substantially parallel with each other, the second bus bar being maintained at a raised level with respect to the first bus bar.

30. The method recited in claim 29 wherein the first coupling device is a standoff configured to raise a connection point of the first bus bar to the first circuit protection device above the second bus bar.

31. The method recited in claim 29 wherein the second coupling device is an adapter plate configured to extend from and parallel to an outer surface of the second bus bar and raise a connection point of the second bus bar to the second circuit protection device above the first bus bar.

32. The method recited in claim 31 wherein the adapter plate is configured to extend the connection point of the second bus bar to the second circuit protection device to be located over a one of the first plurality of contact points in the second chosen circuit location.

33. The method recited in claim 25 further including an alarm strip extending along a length of the first or second bus bars.

34. The method recited in claim 33 further including adding or removing alarm jumpers associated with the alarm strip to associate a first portion of the alarm strip with the first bus bar and associate a second portion of the alarm strip with the second bus bar based on the exchanging and replacing.

35. A method for manufacturing a reconfigurable power distribution panel, comprising:
  forming a first bus bar having a first plurality of contact points thereon and a plurality of circuit protection locations associated therewith;
  forming a second bus bar proximate the first bus bar and having a second plurality of contact points thereon, the second plurality of contact points having the same plurality of circuit protection locations associated therewith;
  providing first and second coupling devices coupleable to a one of the first or second bus bars, respectively, at a chosen circuit protection location; and
  providing a circuit protection device coupleable to either the first bus bar or the second bus bar at the chosen circuit protection location by the selection of either the first or second coupling devices.

36. The method recited in claim 35 further including forming a plurality of output contacts proximate both the first and second bus bars and having the same plurality of circuit protection locations associated therewith, and wherein the circuit protection device coupleable to either the first bus bar or the second bus bar at the chosen circuit protection location is further coupleable to a one of the plurality of output contacts at the chosen circuit protection location.

37. The method recited in claim 36 wherein the first and second bus bars run substantially parallel with each other, the second bus bar being maintained at a raised level with respect to the first bus bar.

38. The method recited in claim 37 wherein the first coupling device is a standoff coupleable to a first contact point on the first bus bar at the chosen circuit location, the standoff configured to raise a connection point of the first bus bar to the circuit protection device above the second bus bar.

39. The method recited in claim 38 wherein the standoff is configured to raise the connection point of the first bus bar to the circuit protection device to a height such that the circuit protection device is not in electrical contact with the second bus bar.

40. The method recited in claim 37 wherein the second coupling device is an adapter plate coupleable to a first contact point on the second bus bar at the chosen circuit location, the adapter plate configured to extend from and parallel to an outer surface of the second bus bar and raise a connection point of the second bus bar to the circuit protection device above the first bus bar.

41. The method recited in claim 40 wherein the adapter plate is configured to extend the connection point of the second bus bar to the circuit protection device to be located over a one of the first plurality of contact points in the chosen circuit location.

42. The method recited in claim 41 wherein the extended location allows the circuit protection device to have a substantially similar mating mechanism to a second protection device coupleable to the first bus bar and a one of the plurality of output contacts.

43. The method recited in claim 35 further including forming an alarm strip extending along a length of the first or second bus bars.

44. The method recited in claim 43 wherein the alarm strip includes one or more alarm jumpers configured to associate a first portion of the alarm strip with the first bus bar and associate a second portion of the alarm strip with the second bus bar.

* * * * *